United States Patent [19]

Gignoux

[11] 4,319,207
[45] Mar. 9, 1982

[54] NARROW-BAND-PASS SWITCHING FOLLOWER FILTER HAVING N SWITCHED PATHS

[75] Inventor: Michel Gignoux, Fontaine, France

[73] Assignee: Commissariat a l'Energie Atomique, Paris, France

[21] Appl. No.: 116,972

[22] Filed: Jan. 30, 1980

[30] Foreign Application Priority Data

Feb. 2, 1979 [FR] France .............................. 79 02752

[51] Int. Cl.³ ..................... H03H 19/00; H03K 5/159; H03K 5/135
[52] U.S. Cl. .................................. 333/173; 328/151; 328/167; 333/174
[58] Field of Search ..................... 333/172, 173, 17 R, 333/18, 165, 174; 328/151, 167; 307/240–243

[56] References Cited

U.S. PATENT DOCUMENTS 3,445,685  5/1969  Roth .............................. 307/242 X
3,532,997  10/1970  Faye .............................. 333/173 X

FOREIGN PATENT DOCUMENTS 2553091  6/1977  Fed. Rep. of Germany ...... 333/173

Primary Examiner—Marvin L. Nussbaum
Attorney, Agent, or Firm—Pearne, Gordon, Sessions, McCoy & Granger

[57] ABSTRACT

In a switching follower filter of the narrow-band-pass type having n switched paths for filtering a signal having a useful component of variable frequency associated with a high background noise, the fundamental frequency of the input signal is captured and then followed by collecting a pre-filtered switching synchronization signal so that part of the input signal remains in the pre-filtered signal.

8 Claims, 13 Drawing Figures

NARROW-BAND-PASS SWITCHING FOLLOWER FILTER HAVING N SWITCHED PATHS

The present invention relates to a switching follower filter and more specifically to a follower filter having n switched paths of the narrow-band-pass type in which the switching-synchronization signal is collected on the downstream side of the filter.

This invention applies to the filtering of a signal having a useful component of variable frequency associated with a high background noise.

A switching follower filter of the narrow-band-pass type must have a very narrow passband centered on the frequency of the useful component of the input signal. This filter must also be capable of capturing and then following the fundamental frequency of the input signal; in other words, the midband frequency of its passband must automatically coincide at each instant with the fundamental frequency of the useful signal component.

Digital-control switching filters are already known in which a certain number n of paths (of resistance-capacitance circuits, for example) are connected sequentially between the input and the output of the filter. Filters which fall into this category are particularly selective and have a passband in which the midband frequency depends on the number of switching cycles performed per second independently of the values of components such as resistors and capacitors which come into operation only in order to characterize the selectivity of the filter. This type of filter cannot readily come into action when the frequency of the input signal varies over a fairly wide frequency band. As a general rule, when it proves necessary to capture and then to follow a signal whose frequency varies over a very wide band, different means are employed for controlling the filter in such a manner as to ensure that its midband frequency coincides with the useful or fundamental frequency of the input signal. These different means produce good results only if the periodic input signal to be followed or to be captured varies only over a narrow frequency band and on condition that said signal is not affected by an unduly high level of noise.

The control means mentioned in the foregoing utilize an external reference frequency $F_R$ in order to control the switching filter having n paths; this frequency must be synchronized either with the fundamental component of the input signal or with the output signal of the filter.

When the frequency $F_R$ is synchronized with the fundamental component of the input signal, the filter is thus designated as an "upstream synchronization" switching follower filter. In order to control switching of the n paths of the filter, it is necessary in this case to collect the input signal, to condition said signal, to filter it in a coarse bandpass filter and then to multiply it by the number n of switching operations to be performed. This type of control of switching operations produces good results only if the input signal has a low level of noise and if the frequency band in which it varies is of small width. These conditions are in fact necessary for ensuring that the switching control signal resulting from frequency multiplication of the input signal by the number n in turn has a low level of noise. In fact, all unwanted phenomena and in particular the noise superimposed on the periodic input signal are again present on the multiplication channel and are multiplied. It is consequently necessary to place a bandpass filter having a fairly narrow band in front of the input signal frequency multiplier before multiplying the input signal for controlling the switching operations. Unfortunately, this filter has the effect of limiting at the same time the signal-following range of the switching follower filter. Should it be desired to obtain a wide signal-following range, it is therefore necessary to place a wide-band filter in front of the multiplier but this filter does not eliminate the noise superimposed on the periodic input signal to a sufficient extent, thereby producing substantial phase jitter at the output of the switching filter. It therefore proves difficult to reach a compromise between the signal-following range and the noise since a filter having an excessively narrow band is placed in front of the multiplier and the signal-following range of the follower filter is also very narrow.

The result of these observations is that an "upstream synchronization" switching follower filter is employed in the majority of instances only in order to filter periodic signals whose frequency deviates from a predetermined value only to a slight extent; this is the case, for example, with the 50 or 60 cps periodic signals of the mains supply.

Another means for controlling the switching of the n paths of the follower filter consists in synchronizing the switching operations by collecting the synchronous signal of the input signal at the output of the follower filter. It will be said in this case that the switching follower filter is of the "downstream synchronization" type. In this case the synchronization signal collected downstream of the switching follower filter is already powerfully filtered and is again filtered by a low-pass filter before being applied to the multiplier which is intended to control the switching operations of the follower filter. The sole limitations which appear in this type of control of switching of the n paths of the follower filter relate to the operating range both of the multiplier and of the low-pass filter which precedes said multiplier. This low-pass filter is necessary for smoothing the filtered signal derived from the follower filter. In fact, this filtered signal is produced in the form of stair-steps which are liable to produce ambiguities, especially at the zero-crossing of the filtered signal.

In this type of follower filter which provides switching by "downstream synchronization", the filter is not excited at the outset and it is necessary to provide a starting circuit for capturing the input signal. This starting circuit is so designed as to adjust the mid-band frequency of the switching filter to the fundamental frequency of the input signal. In fact, the transfer function of a filter having n paths or n circuits is constituted by the elementary transfer function of the circuit placed in one of the paths, the function just mentioned being made periodic within the frequency range. Thus said elementary transfer function is of small width and it is this property in particular which is sought in selective filtering. The resultant transfer function appears as a series of lines which decrease in width as the value n becomes higher. The shape of this series of lines results in a switching filter which is designated as a "comb filter".

Apart from the passive filters of order higher than 1, elementary filters which are also worthy of mention can consist of active filters of the first order or of a higher order (of the class of internal-reference analog filters), digital filters (with external reference but a digital output; the output signals of an n-path filter of this type are constituted in this case by a series of digital words). There can finally be mentioned the external-reference analog filters or alternatively the capacitance-switching filters proper.

In the case of a switching follower filter of the downstream synchronization type having n paths, provision can be made in the series of capacitors of the paths for a certain number N of capacitors of lower value. At the outset, the filter behaves as a filter having M positions but with a smaller time constant. In this case, said time constant is in fact equal to MRC instead of nRC, if R and C designate the values of the resistors and capacitors of each of the paths. The filter consequently has a passband of greater width at the outset and can then include the desired frequency. Once the capture has been performed, the filter behaves as a composite filter having a bandwidth within the range of 2/MRC to 2/nRC.

As will be explained below in detail, the switching synchronization signal can be obtained from the output of the filter if its transfer function is such that a sufficient portion of the input signal passes to the output of the filter. Said synchronization signal can also be such as to modify the transfer function of the filter so as to pass a controllable part of the input signal to the filter output.

In the case of a very selective switching filter, the signal which is present at the input is not in any way likely to re-appear at the output if the filter is not associated with a starting circuit for capturing the input signal.

Different starting or signal-capturing devices are already known. Such devices produce action either on the control signal by connecting it temporarily to a local reference whose frequency is varied progressively or to the bandwidth of the filter. When capture takes place, the starting or capturing circuit is disconnected, whereupon the filter alone follows the input signal provided that the instantaneous variation of this latter does not exceed the passband width of said filter.

The known filters just described as well as the capturing or starting circuits associated therewith are all characterized by discontinuous operation. In point of fact, the input signal must successively be detected and then followed, thus entailing the need to change from one mode of operation to the other. This has the effect of complicating the circuits or auxiliary devices for controlling the switching filter, which may result in untimely or unexpected operation of the capturing system under certain circumstances. In consequence, it often proves necessary to make provision for additional procedures which overcome these disadvantages.

The aim of the present invention is to provide a remedy for the drawbacks outlined in the foregoing and especially to provide a switching follower filter in which following and capturing of the input signal are carried out by having recourse to simple expedients involving the use of means for collecting a pre-filtered switching synchronization signal so that part of the input signal of the filter remains in said pre-filtered signal. These means do not introduce any limitation of the input signal frequency range, have low sensitivity to the background noise which accompanies the fundamental component of said input signal and also enable the switching follower filters to retain their highly selective character. The follower filter according to the invention can have paths which may or may not be identical.

The invention is directed to a narrow-band-pass switching follower filter having n switched paths, comprising means for collecting a pre-filtered path-switching synchronization signal. The filter is distinguished by the fact that the means for collecting the pre-filtered signal are so designed that part of the input signal of the filter remains in said pre-filtered signal.

According to another distinctive feature, the means aforementioned collect the pre-filtered signal on the downstream side of the filter.

According to yet another distinctive feature, the means aforementioned collect the pre-filtered signal at a point such that the portion of the input signal which remains in the output signal of the filter is minimized with respect to the portion of the input signal which appears in the pre-filtered signal.

According to a further distinctive feature in which each path comprises one reactive element, the means for collecting the pre-filtered signal comprise an impedance connected in series with all the reactive elements of the n paths.

According to yet a further distinctive feature in which each path comprises one reactive element, the means for collecting the pre-filtered signal comprise in the case of each path one impedance connected in series with the reactive element of said path.

According to again another distinctive feature, said impedance comprises a resistor connected in parallel with a capacitor.

According to a particular feature, said impedance comprises a variable resistor connected in parallel with a capacitor.

According to still another particular feature, the follower filter comprises means for suppressing the impedance during operation of the filter.

Further properties and advantages of the invention will become more readily apparent from the following description which is given solely by way of explanatory illustration, reference being made to the accompanying drawings, wherein.

Figure 1A:
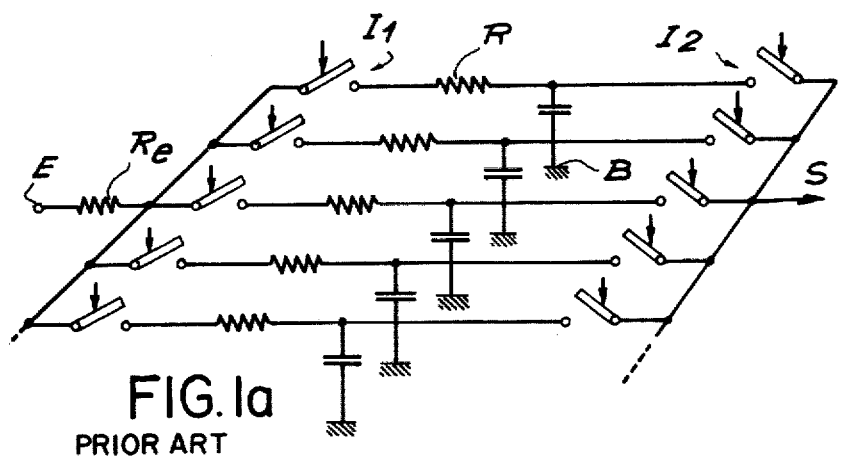
FIG. 1a is a schematic diagram of a series-type n-path switching filter which is known in the present state of the technique.

Referring now to FIG. 1a, there is shown a series-type n-path switching filter of the prior art. This filter comprises an input resistor $R_e$ connected in series with n filter networks which are present respectively on n paths. Said paths can be switched by means of controllable switches such as those designated by the references $I_1$, $I_2$. In the example of construction which is illustrated, each filter network is constituted by a resistor R associated with a capacitor C, one terminal of which is brought to a reference potential B. The input signal to be filtered is applied to the input E of the filter whilst the filtered output signal is obtained at F. This type of switching filter which is known in the present state of the technique can be designated as a switching filter having n repetitively sampled paths. This filter is highly selective and operates by collecting part of the input signal successively in the n paths disposed across the signal transmission path. As a general rule, the filter networks of the different paths are identical and the instants at which the signal is collected in each path are uniformly distributed in time and do not overlap when passing from one path to the next in a cyclic manner. The known means for controlling the switches $I_1$, $I_2$ in cyclic manner are not shown in this figure. Such means can consist of logic circuits whilst the controllable switches $I_1$, $I_2$ can consist of field-effect transistors. Since the n paths are switched cyclically and succeed each other across the signal path, the filter response is not time-independent. If the time constant of each filter network of each path is of high value with respect to the switching time, the resultant transfer function is symmetrical with respect to the switching frequency. If the sine-wave signal applied to the input of the filter has a fundamental component of frequency $f_0$ at each period, each capacitor C is set by the value of the signal applied thereto during the cycle. This value does not change if the switching is synchronous with the fundamental component of the input signal. Each capacitor is charged during the time interval which is assigned to it during switching operations and this charge is maintained for the rest of the time. In steady-state operation, each capacitor is restored to the signal value at which it is set. At the filter output, the signal obtained is an approximate form of the input signal in uniformly distributed discrete values. The characteristics of the bandpass filter as thus designed and illustrated in the figure are determined by the elements of the low-pass filter constituted by each network of each path. The selectivity or the passband of said filter having n switched paths is clearly dependent on the number n. The sampling effect on the low-pass filter networks of each path in fact produces, not a single low-pass response centered on the fundamental frequency $f_0$ of the input signal, but an entire series of bands centered on the harmonics of the frequency $f_0$ and on the frequency 0.

As will become apparent hereinafter, the general form of the response of this n-path switching filter is characteristic of the sampling operation. In particular, if n is the number of paths, the system has a zero response in the case of the frequencies $nf_0$, $2nf_0$, etc . . . . It is for this reason that these filters are often known as comb filters and that the lines centered on the frequencies $f_0$, $2f_0$, etc . . . are designated as comb teeth.

Figure 1B:
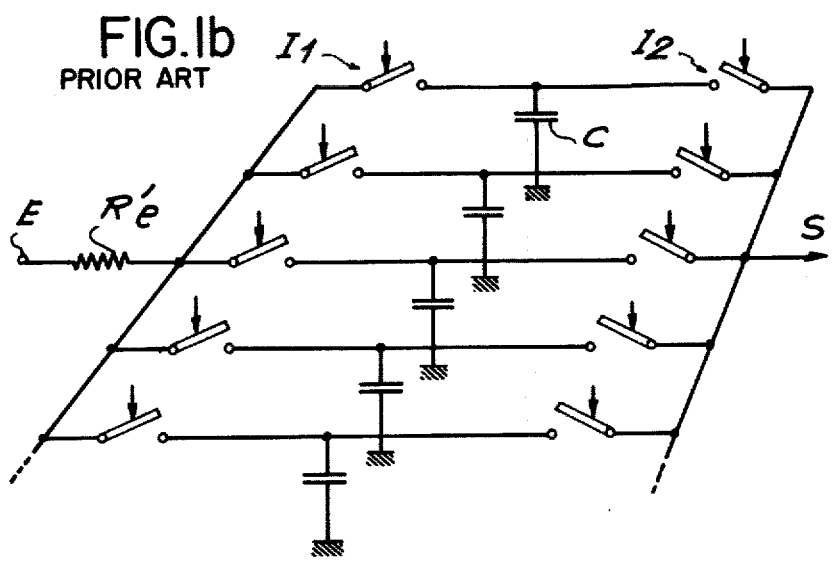
FIG. 1b is an equivalent diagram of the aforesaid series-type switching filter.

Referring now to FIG. 1b, this figure shows an equivalent diagram of the previous series-type switching filter. In this equivalent diagram, the input resistance $R'_e$ is equivalent to the input resistance $R_e$ and to the resistance R of each path; the equivalent filter thus obtained is in fact a filter of a series type since the sampling gates or switches $I_1$ and $I_2$ are placed between the signal input E and the signal output S. The main advantage of this arrangement is that the passage resistors of the switches $I_1$ and $I_2$ of each path are placed in series with the purely resistive element $R'_e$ and that the element C retains its purely reactive character. The switches $I_1$ and $I_2$ can be actuated either simultaneously or with a predetermined and fixed relative displacement in time. This accordingly results in a fixed phase displacement at the output; this series type arrangement alone permits such a phase displacement.

The series-type n-path switching filter described in the foregoing with reference to FIGS. 1a and 1b can be designated as a comb filter; it can readily be converted to an n-path switching filter of the bandpass type when it is followed by a coarse bandpass filter which is sufficient to give preference to only one line of the comb.

Figure 1C:
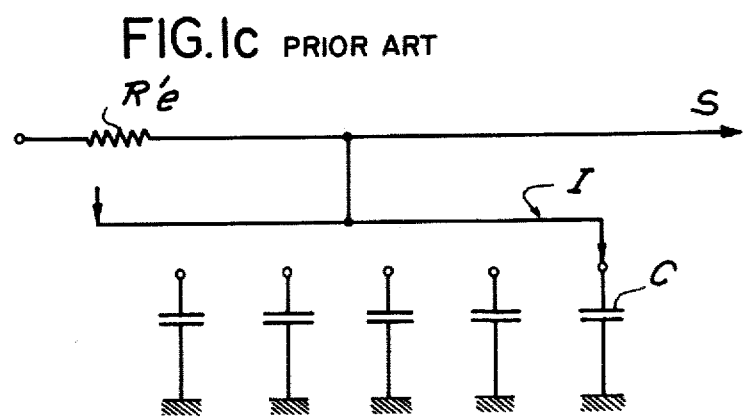
FIG. 1c shows a shunt-type n-path switching filter which is known in the present state of the technique and the diagram of which is derived from the equivalent diagram of the "series" structure filter of FIG. 1b.

FIG. 1c shows an n-path switching filter of the shunt type already employed in the prior art. The diagram of this filter is derived from the equivalent diagram of the series-structure filter of FIG. 1b. It is apparent from the equivalent diagram of FIG. 1b that, if it is not desired to introduce a phase-shaft between the input and output signals of the filter, one of the switches $I_1$ or $I_2$ can be dispensed with in each path and replaced by a single controllable switch I which serves to connect each capacitor C successively and periodically to the input resistor $R'_e$. The shunt-structure filter shown in FIG. 1c is more economical in constructional design but does not make it possible to introduce a phase-shift between the output and input signals as is the case with the filter which has a series structure.

In the filters having either a series structure or a shunt structure as described in the foregoing, the switches are of the analog type; they perform an analog gate function and are usually constituted by field-effect transistors which are either fully turned-off or driven into saturation as a function of the switching signals applied to their gates.

Figure 2:
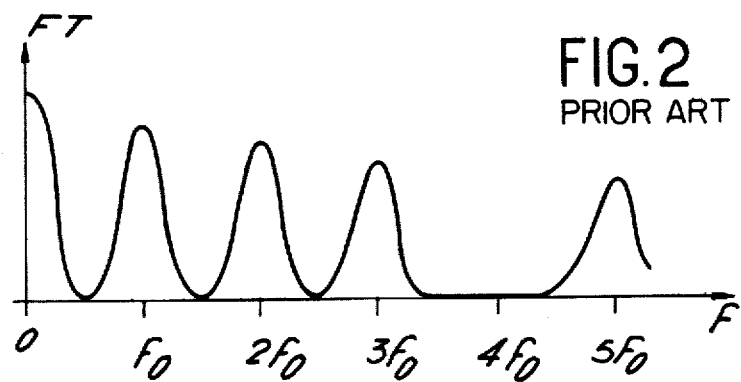
FIG. 2 is a diagram illustrating the transfer function $F_T$ of one of the above-mentioned filters as a function of the frequency f of the signal at the input of said filter.

Reference will now be made to the diagram of FIG. 2 which illustrates the transfer function $F_f$ of one of the above-mentioned filters as a function of the frequency $f$ of the signal applied to the input of said filter. As explained earlier, the filters described in the preceding figures are bandpass filters of the so-called "comb" type in which the resultant transfer function is symmetrical with respect to the switching frequency $f_0$. One of the original features of these filters lies in the fact that, if the switching frequency $f_0$ is changed, the center frequency of the bandpass filter having n switched paths is changed without changing the bandwidth. However, as has already been mentioned, the designation of "comb filter" arises from the fact that the sampling operation does not produce a single bandpass response centered on $f_0$ but produces a whole series of bands centered on the harmonics of $f_0$ and the frequency O, as shown in FIG. 2. The transfer function represented in FIG. 2 is characteristic of a four-path sampled filter. The comb teeth designate the lines at $f_0$, $2f_0$, etc . . . . The relative time-duration of sampling operations is not critical. The sum of time-durations of these samples, however, must be strictly equal to the period $T_0$ of the fundamental component of the input signal. If this condition is not observed, widening of the line will take place at the frequency $f_0$.

The switching filters described in the foregoing and known in the present state of the art have the main disadvantage of restituting a signal which is only an approximation of the input signal in discrete values. This restituted signal contains harmonics which do not exist at the input of the filter. In order to eliminate these harmonics, it is necessary to place at the output of the switching filter a low-pass filter having transfer and phase characteristics which are superimposed on those of the switching filter and sometimes reduce the advantage of this latter. Said switching filters must deliver a switching control signal whose frequency is distinctly higher than the highest-order harmonic to be analyzed. The signal which controls these switching operations is a logic signal whose frequency determines the frequency of the lines of the comb.

As mentioned earlier, it is a known practice to displace the lines aforesaid and in particular to follow the input signal either by collecting a switching synchronization signal on the upstream side of the filter or by collecting a switching synchronization signal on the downstream side of the filter. If the synchronization signal is collected upstream of the filter, the switching operations are controlled by means of a bandpass filter which receives the input signal and controls a scale-of-n multiplier. If the signal-following range is very wide, the bandpass filter must have a very wide band, which is liable to produce considerable phase jitter at the output of the switching filter. In consequence, the bandpass filter which controls the multiplier must be a fairly selective filter which considerably reduces the signal-following range of the switching filter. An upstream signal-following switching filter can therefore be employed only for periodic signals having a frequency which is subject to very little deviation from a predetermined value.

As mentioned earlier, it is preferable to collect the switching synchronization signal on the downstream side of the switching follower filter. In this case, said signal is collected downstream of the filter by means of a low-pass filter having a cut-off frequency which is, for example, as high as $nf_0$. Said low-pass filter controls a multiplier, the outputs of which control the switching of n paths. However, when a useful signal appears at the input of a filter of this type, it does not re-appear at the output. Steps must accordingly be made on the one hand to capture the input signal and on the other hand to follow this latter when its frequency varies. In fact, if capture of the input signal is carried out on a signal of predetermined frequency f, it is necessary to ensure in the event of variation of f that this variation is again present sufficiently early at the output of the multiplier before the frequency f passes out of the pass-band of the switching filter. If this condition is not satisfied, the switching filter returns to its initial state; it is therefore necessary to contemplate the need to follow the input signal. Different systems for capturing and following the input signal by downstream synchronization are already known. For capture to take place, it is necessary and sufficient to ensure that the frequency to be followed appears at the output of the switching filter at a given moment and with a sufficient level to excite the multiplier. Among the different signal-capturing systems which are already known, the following are worthy of mention:

- capture by ramp-function sweeping: during the waiting period preceding the appearance of the signal having a frequency f at the input of the filter, the multiplier is excited by a variable frequency which sweeps the entire signal-capture range according to a ramp function. When the frequency of filter switching coincides with the frequency f of the input signal, the filter captures the signal and it is then possible to disconnect the ramp-function generator;
- capture by filter network system: in a system of this type, a plurality of switching filters are disposed in parallel and driven by the same input signal. The mid-band frequencies of said filters are relatively displaced by one filter bandwidth. Among all these filters which are arranged in parallel, at least one filter captures the input signal and makes it possible to follow said signal;
- capture of phase measurement: it is known that a switching filter does not phase-shift the frequency on which it is centered. It is therefore possible to provide a system which disconnects when the phase is cancelled, that is to say when capture of the input signal effectively takes place.

Other types of filters provided with known capturing systems already exist but will not be described in detail here. As is the case with the systems mentioned above, they have a disadvantage in that, apart from capture of the input signal, they do not make it possible to follow this signal when its frequency varies to a very substantial extent. Moreover, all the sytems which have just been described call for auxiliary circuits which considerably increase the cost of manufacture of switching filters.

Figure 3:
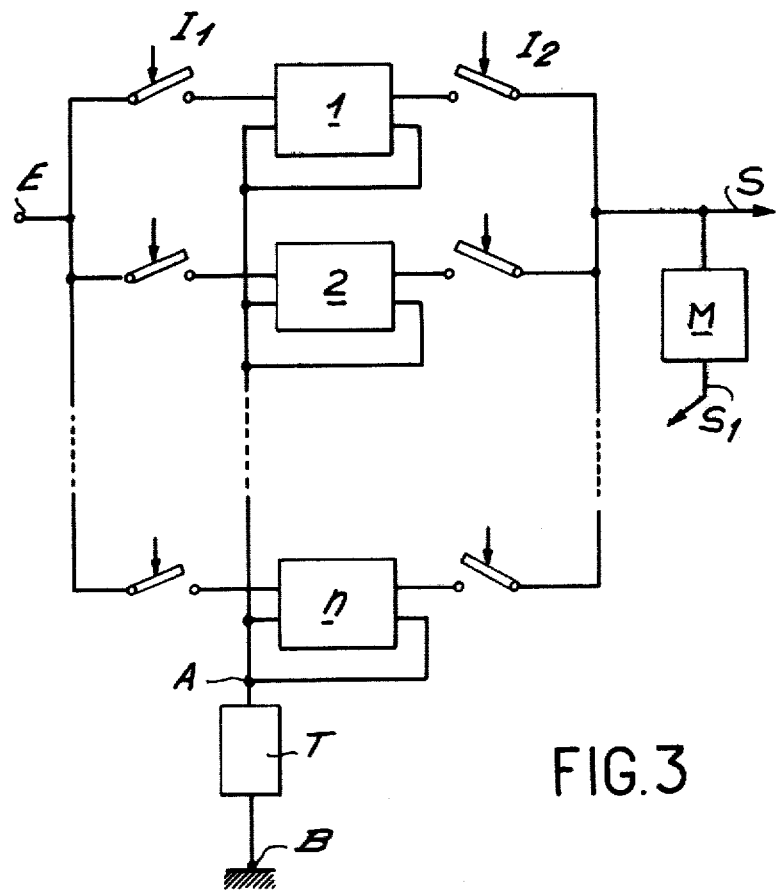
FIG. 3 is a block diagram of a series-type n-path switching follower filter according to the invention and including an impedance for modifying the transfer function of the filter; this impedance is connected in series with all the reactive elements of the n paths.

Reference will now be made to FIG. 3 which shows diagrammatically a series-type n-path switching follower filter according to the invention and including an impedance for modifying the transfer function of the filter. This switching follower filter has two series of switches such as those designated by the references $I_1$ and $I_2$ which are placed on each side of the filter cells or networks of each path; these filter networks are represented in the figure in the form of quadripoles or fourterminal networks 1, 2-n which comprise at least one reactive element and certain examples of which will be described in detail hereinafter. This follower filter further comprises control means M for collecting an n-path switching synchronization signal on the downstream side of the filter, namely on the side corresponding to the filter output S. These switching control means deliver at their output $S_1$ control signals which initiate closing or opening of the switches $I_1$ and $I_2$ of each path. It is readily apparent that the switches $I_1$ and $I_2$ can be of the electronic type and be constituted, for example, by field-effect transistors having either a cut-off state or a saturated state. Means T constituted by a dipole inserted between the common node A (common to all the quadripoles) and a point B which is brought to a reference potential make it possible to modify the transfer function of the filter in order to pass to the output of said filter part of the signal which arrives at the filter input E. As will be explained below in detail, said dipole is an impedance which comprises, for example, a resistance connected in parallel with a capacitor. The presence of this impedance modifies the transfer function of the switching filter; this transfer function is superimposed on that of the dipole. This modification of the transfer function of the filter will be described in detail hereinafter. The presence of said impedance enables the n-path switching filter to capture the input signal when the fundamental frequency of this latter varies to a very substantial extent. The impedance in this case is connected in series with all the reactive elements of the n paths.

Figure 4:
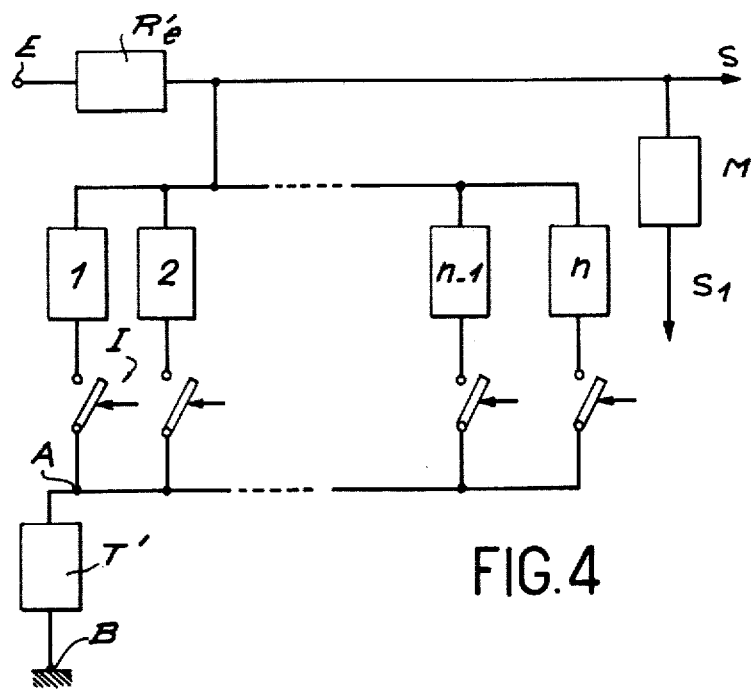
FIG. 4 is a block diagram of a shunt-type n-path switching follower filter according to the invention and including an impedance for modifying the transfer function of the filter; this impedance is connected in series with all the reactive elements of the n paths.

Referring now to FIG. 4, there is shown diagrammatically in this figure a shunt-type n-path switching follower filter according to the invention and including an impedance T' for modifying the transfer function of the filter. This impedance is connected in series with all the filter networks 1, 2-n-l, n, of the n paths. Said impedance is located between the node A which is common to all the dipoles constituting the filter networks of the different paths and a point B which is brought to a reference potential. As has been noted earlier, each path in this shunt-type structure has only one switch located at the output of each filter network. The reference $R'_e$ designates a resistor which is common to all the paths. As in the previous instances, means M serve to collect a synchronizing signal downstream of the filter on the side corresponding to the output S of this latter. Switching of the different paths is initiated through the output $S_1$ of said means M. As can readily be understood, the switches I can consist of field-effect transistors which receive the control signals delivered by the means M and are triggered successively either into the cut-off state or into the saturation state. The means T' which serve to modify the transfer function of the filter and are not illustrated in detail in this figure consist of an impedance comprising, for example, a resistor connected in parallel with a capacitor. As in the previous instance, the presence of this impedance modifies the transfer function of the complete assembly, with the result that the transfer function of the switching filter is superimposed on the transfer function of said impedance. As will be explained in detail hereinafter, said impedance makes it possible both to capture and follow the input signal E even if the frequency of said signal varies over a very wide range.

In the filter described in the foregoing with reference to FIGS. 3 and 4, it will be said that the impedance for modifying the transfer function of the filter endows this latter with a possibility of capture by "toe" which is "non-sampled" since this impedance is common to all the paths in these two figures.

Figure 5:
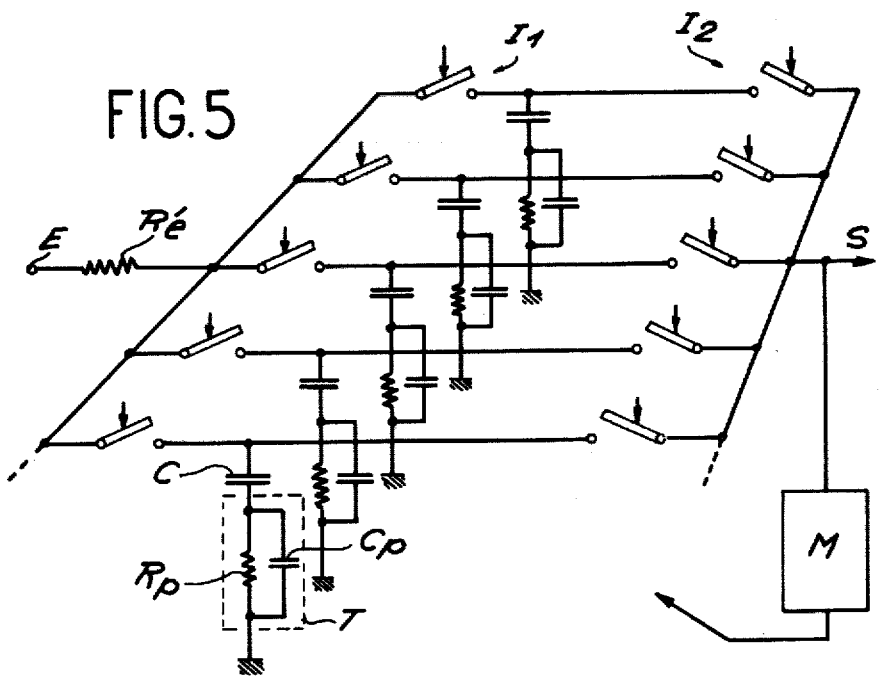
FIG. 5 is a schematic diagram of a series-type n-path switching follower filter including a path-switching synchronization control loop; in the filter shown in this diagram, an impedance for modifying the transfer function of the filter is connected in series with the reactive element of each path.

With reference to FIG. 5, this diagram shows a series-type n-path switching follower filter which includes a loop for controlling "downstream" synchronization of path-switching operations. In the filter shown in this figure, an impedance T for modifying the transfer function of the filter is connected in series with the reactive element C of each path. Said impedance T is constituted by a resistor $R_p$ connected in parallel with a capacitor $C_p$. The synchronization control loop comprises control means M for collecting a synchronizing signal downstream of the switching filter on the side corresponding to the output S of this latter in order to initiate opening or closing of the switches such as $I_1$ and $I_2$ of the different paths. There is also shown in this figure an input resistor $R'_3$ which is common to all the paths and placed at the input E of the filter. The means M will be described below in detail. The transfer function of each path is modified by the presence of the impedance T. The result produced by this modification on the total transfer function of the switching follower filter is such that the modulus of the transfer function is never zero in the desired capture band and its value is sufficient to ensure synchronization of the switching control means.

Figure 6:
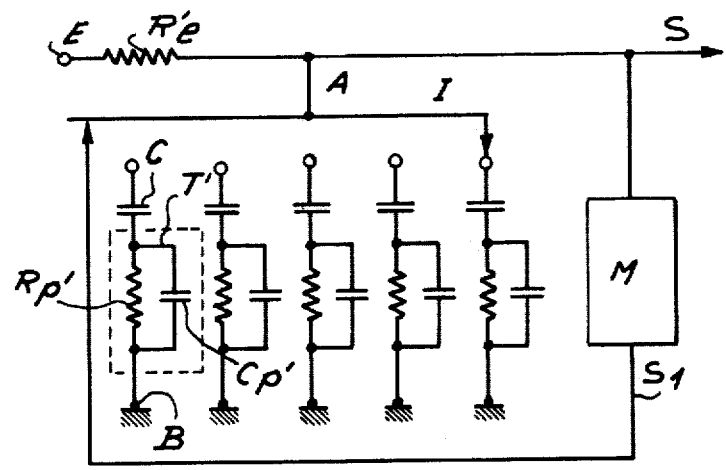
FIG. 6 is a schematic diagram of a shunt-type n-path switching follower filter including means for collecting a path-switching synchronization signal on the downstream side of the filter; in the filter shown in this diagram, an impedance for modifying the transfer function of the filter is connected in series with the reactive element of each path.

Referring now to FIG. 6, this diagram shows a shunt-type n-path switching follower filter including means M for collecting a path-switching synchronization and control signal on the downstream side of the filter corresponding to the output S of this latter. In the filter shown in this figure, an impedance T' for modifying the transfer function of the filter is connected in series with the reactive element C of each path. Said impedance T' consisting of a resistor $R'_p$ connected in parallel with a capacitor $C'_p$ is located between the reactive element C and a point B which is brought to a reference potential. The control means M initiate either closing or opening of the switches I. As in the foregoing and in the case of any structure of the shunt type, a resistor $R'_e$ common to all the paths is connected between the input E of the filter and the node A which is common to all the paths. The impedance T' makes it possible to modify the transfer function of each path, with the result that the modulus of the total transfer function of the filter is never zero and that its value is sufficient to ensure synchronization of the switching control circuit.

The filters described in the foregoing with reference to FIGS. 5 and 6 have an impedance in series with the reactive element of each path and are designated in this case as n-path switching follower filters with "sampled toe" capture of the input signal.

Figure 7:
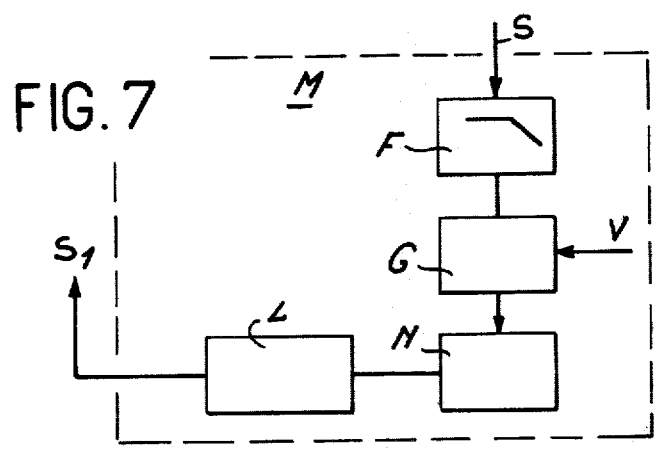
FIG. 7 is a block diagram showing one form of construction of means for collecting a path-switching synchronization signal on the downstream side of the filter; in this embodiment, said means include in particular an amplifier of the automatic gain control type.

In FIG. 7, there is shown a first embodiment of the synchronizing and control means M which serve to collect a signal which is synchronous with the input signal on the downstream side of the filter and to initiate switching operations. In this embodiment, the means M may include an amplifier G if necessary. The output signal S of the switching filter is applied to said amplifier via a low-pass filter F. The amplifier is followed by a multiplier N which serves to multiply the frequency of the signal received from said amplifier by the number n of switching operations. Said multiplier is connected to a logical unit L which serves to decode the output signals of the multiplier and to carry out by means of output signals $S_1$ switching of the different paths within the series-type or shunt-type follower filters according to the invention.

Figure 8:
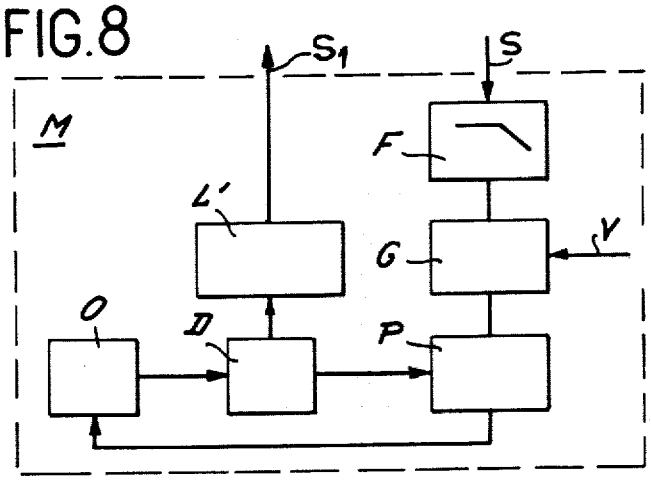
FIG. 8 is a block diagram showing a particular form of construction of means for collecting a path-switching synchronization signal on the downstream side of the filter; in this embodiment, said means include in particular a phase-locked loop.

Referring now to FIG. 8, the particular embodiment of the multiplier N shown in this figure comprises a phase-locked loop. Said loop includes a low-pass filter F to which the output signal of the switching filter is applied and may also include an amplifier G. A phasemeter P receives on the one hand the output signal of said low-pass filter and on the other hand the output signal of a divider D which makes it possible to divide by n the frequency of the output signal of an oscillator O. This oscillator is controlled by the output signal of the phasemeter P so as to oscillate at a frequency equal to n times that of the useful component of the input signal of the switching filter. The state of the divider D is therefore modified with this frequency which is n times higher than that of said useful component of the input signal. The divider D is connected to a logic circuit L'. The output signals $S_1$ of said logic circuit control the switches of the different paths of the shunt-type or series-type follower filters according to the invention.

The control means just described with reference to FIGS. 7 and 8 enable the follower filters according to the invention to follow the variations in frequency of the input signal to be filtered. Capture of this signal is in fact carried out by means of the impedance described earlier, said impedance being placed in each path or being common to all paths.

According to an improvement of the invention, the amplifier G can be of the automatic gain control type which is already known in the present state of the technique. This amplifier is responsive to any difference between the level of its output signal and a constant level V, with the result that a reaction is produced on the amplifier gain in order to cancel this difference. Said amplifier has a very high gain at the zero input level and serves to lock the switching operations to the frequency of the useful component of the input signal. As soon as locking is completed, the gain of the amplifier G decreases sharply.

Figure 9:
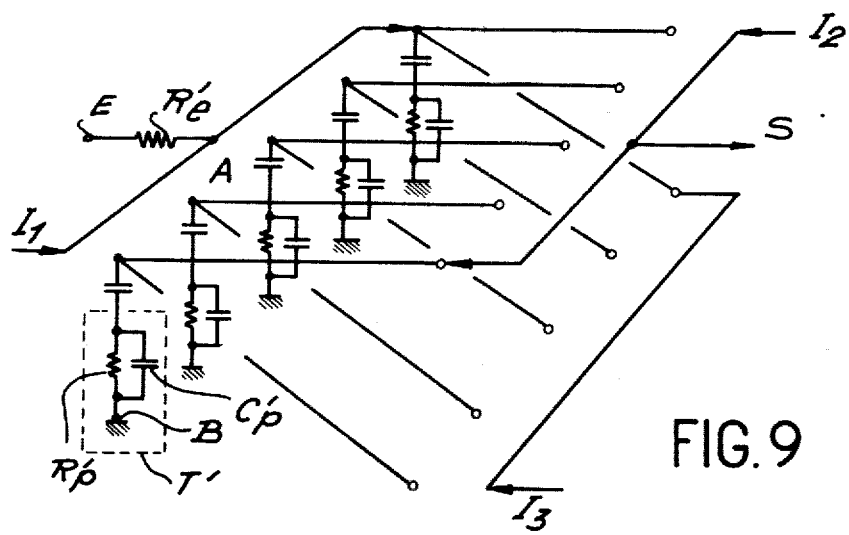
FIG. 9 is a schematic diagram of a switching follower filter according to the invention for phase-shifting the filtered signal with respect to the useful component of the input signal.

With reference to FIG. 9, there is shown diagrammatically another embodiment of an n-path switching follower filter according to the invention. Means are provided in this embodiment for phase-shifting the switching control signals with respect to the synchronous signal of the fundamental component of the input signal in order to obtain at the filter output a signal which is phase-shifted with respect to the input signal.

It has been noted earlier that a single series-type switching filter serves to carry out phase shifts between the output signal and the input signal by controlling each switch $l_1$ and $I_2$ independently. It is therefore possible to produce "downstream" synchronization follower filters of the series type; in this case, however, only a follower filter which includes an impedance connected in series and common to all the paths can be employed. As explained earlier, this corresponds to a series-type follower filter having a so-called "non-sampled toe". A follower filter according to the invention which includes an impedance in each path and makes it possible to modify the transfer function of the filter while retaining a possibility of phase-shifting of the output signal with respect to the input signal is shown in FIG. 9. This filter comprises an input resistor $R'_e$ connected between the filter input E and a node A which is common to all paths. As in previous embodiments, each path comprises a capacitor C associated with the resistor $R'_e$ and constituting the filter network which corresponds to said path. An impedance T' constituted by a resistor $R'_p$ is connected in parallel with a capacitor $C'_p$ and makes it possible to modify the transfer function of each path as noted earlier. It will be apparent that this impedance is connected between the capacitor C and the reference potential B. Said filter comprises three series of switches $I_1$, $I_2$, $I_3$ and operates in the following manner: the series of switches $I_3$ is placed in parallel with the series of switches $I_2$. The switches $I_3$ are controlled by signals which are synchronous with the control signals of the switches $I_1$ and $I_2$ but relatively displaced by the value which is necessary in order to obtain the desired phase shift between the output signal S of the filter and the input signal E. There are not shown in this figure the means for controlling the different switches and for collecting at the outputs S of the filter a signal which is synchronous with the input signal. These means have already been described in detail in the foregoing.

Figure 10:
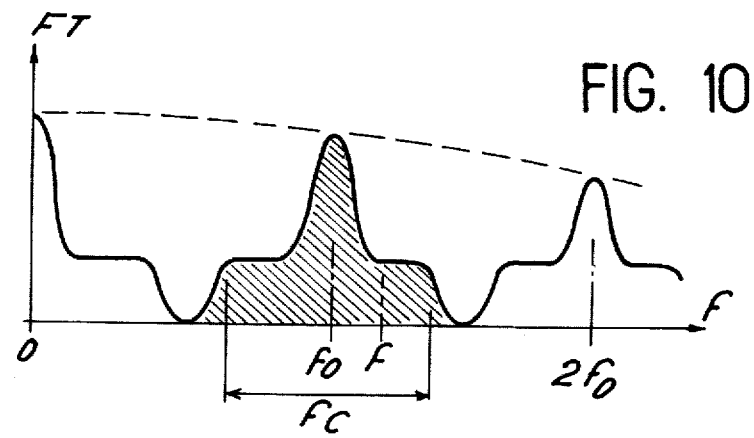
FIG. 10 is a diagram illustrating the transfer function $F_T$ of a switching follower filter according to the invention as shown in one of FIGS. 3 to 9 and having an impedance which makes it possible to modify the transfer function of the filter so as to pass part of the input signal at the filter output.

FIG. 10 is a diagram representing the transfer function $F_T$ of the switching follower filters according to the invention as described with reference to FIGS. 3 to 9. As mentioned earlier, the invention consists in introducing into all the filter paths or into each path an impedance for modifying the total transfer function of the filter in order to permit transmission of part of the input signal at the output of said filter. This impedance provides favorable conditions for capture of the input signal of the filter in the event that the frequency of said signal has a very wide range of variation. This signal capture has been designated as a process of "capture by toe". The transfer function $F_T$ of the filter according to the invention as a function of the frequency f causes the appearance of a pedestal opposite to each comb tooth. This pedestal arises from the presence of the impedance which is connected in series with each path or with all the paths of the filter. As shown in the figure which represents the case of a filter comprising one impedance in each path, part of the input signal is transmitted to the output of the filter. The pedestal is limited to the signal-following band $f_c$ on each side of the fundamental frequency $f_O$ of the input signal. When no input signal is present, the switching filter equipped with switching control means as described earlier is positioned on $f_O$ at the center of the capturing range. When an input signal of frequency f to be captured is present at the input of the filter, part of this signal re-appears at the output by virtue of the "toe". The switching filter is centered on the frequency f by permitting transmission of the entire signal. This capturing process is not immediate since the switching control means are excited at the outset only by a signal of small amplitude and affected by noise. A certain length of time therefore has to be allowed in order to charge the capacitors of the filter. It is apparent from this figure that, by virtue of the modification of the transfer function of the filter, the signal which is present at the filter input and the frequency of which is liable to vary passes readily at all frequencies and in particular at the frequencies of the signal-capture range. The entire fundamental component of the input signal passes at the locations of the comb teeth.

If use is made of the particular arrangement described with reference to FIGS. 7 and 8 (amplifier G with automatic gain control), the pedestal shown in FIG. 10 has a variable height during operation. This height is substantial during the input signal capture stage but is considerably smaller in the course of the signal-following stage during which the transfer function of the filter is thus in no way disturbed by the capturing device.

Figure 11:
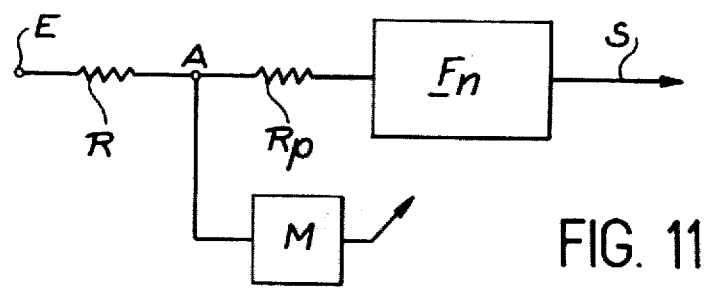
FIG. 11 shows another form of construction of means for collecting a switching-synchronization signal.

Referring now to FIG. 11, there is shown another embodiment of a filter according to the invention in which the prefiltered signal which serves to synchronize the switching operations is collected at a point of the filter such that the part of the input signal which remains in the output signal of said filter is minimized with respect to that part of the input signal which appears in the prefiltered signal. In this embodiment, the transfer function of the n-path filter $F_n$ of the series or shunt type is modified so as to pass only part of the input signal and therefore of the background noises to the output of said filter and only on the switching synchronization channel; the channel which is intended to be employed for processing the input signal is not affected. In this figure, the means for collecting a path-synchronizing signal are shown at M. The output of the filter is designated by the reference S whilst the filter input is designated by the reference E. The defects which are accepted in order to achieve automatic synchronization are found only on the synchronization control channel. The resistor $R_P$ which makes it possible to obtain the signal-capturing toe in this embodiment is placed in series at the input of the filter with a common resistor R. The transfer function on the input signal processing channel which comprises the series-type or shunt-type n-path follower filter $F_n$ is not affected by the presence of the resistor $R_p$. This transfer function depends solely on the sum of values of the resistors R and $R_p$; the values of these resistors can be adjusted independently. Irrespective of the state of the filter, there is observed on the output S of this latter a transfer function which is not modified and has an extremely selective comb configuration which is characteristic of the n-path filter. At the node A which is common to the resistors R and $R_p$, said transfer function is not the same and has a "toe" which results from the presence of the resistor $R_p$ on the downstream side of the node A. At A, the total transfer function of the n-path filter is again found but modified. In addition, part of the input signal and of the input noise is again present at any moment. It is this part of the input signal which is employed in the path synchronization channel in order to ensure signal-capturing and following as in the previous embodiments.

On the synchronization channel M, that part of the noise which is accepted in order to ensure the signal-capturing and frequency-following function need no longer be limited with as much care as in the other embodiments. In fact, in the embodiment comprising a phase-locked loop, the disadvantages arising from the presence of noises are limited to the signal capture range itself (noise rejection effect of the phase-locked loop).

It is apparent that this part of the noise affects the behavior of the synchronization channel and results in phase jitter of the digital synchronization signal. Phase jitter gives rise to an equivalent uncertainty in regard to the position of the comb teeth on the frequency axis. In contrast to the previous embodiments, however, the characteristics of the filter transfer function are maintained in spite of frequency jumping. In this embodiment, the design concept of the filter is simplified and the result obtained is equivalent and even better than that obtained in the case of a sampled toe. The sampled toe itself constitutes an improvement over the simple toe which is common to the n paths.

The resistor $R_p$ is common to the N paths and remains controllable. In fact, the resistor can be adjusted or suppressed by simple means.

In another embodiment which is not shown in the drawings and corresponds substantially to the circuit arrangement of FIG. 9, a third switch having n additional positions or steps and controlled by a proper signal having a frequency nf' makes it possible to scan the state of the n paths in succession. There is thus obtained on a channel which is separate from the input signal processing channel a signal having the same shape as the output signal of the processing channel of the filter having n switched paths prior to incorporation of said additional switch. The frequency of said signal on said separate channel can be either proportional to the frequency of the input signal (multiple or submultiple) or proportional to a fixed frequency. In the case of a frequency which is proportional to the frequency of the input signal, there is obtained a frequency multiplier or divider for multiplication or division by an even or odd integer, a fraction or a number of any desired value while maintaining the waveform of said signal without any distortion other than that which is produced by the limited number of paths. In the case of a fixed-frequency output, the waveform of the input signal is recovered by eliminating frequency fluctuations (phase jitter), which is of considerable interest in the field of synthesis of complex periodic signals or in the field of detection of a signal waveform. In fact, when phase jitter is eliminated, the signal can be compared very precisely to a reference signal produced at the same frequency f' and enhanced discriminating power is achieved. Thus it is not only possible to remove phase jitter from the signal but also to bring this latter into phase coincidence with the reference generator which delivers signals at a known fixed frequency.

At the output of a follower filter, the signal has an inherently variable frequency. This causes difficulties in regard to utilization of the signal and a number of cases can arise:

the signal can be utilized directly in its time-dependent form. Since the phenomenon is not stationary, writing of the signal in nonvolatile manner on a graphic recording medium, for example, gives rise to distortion problems: the time axis is no longer in relation with the period;

the result of filtering can also be utilized by passing into the frequency field by means of a Fourier transform, for example. Since the response is not of fixed frequency, this results in "blurring" or "streaking", with the result that utilization is sometimes difficult or impossible.

A fixed-frequency output solves these two problems of utilization. This makes it possible to solve in particular the problem of detection of periodic signals masked by a background noise.

Moreover, in the different embodiments of the switching follower filter according to the invention and described in the foregoing, the sampled or non-sampled "toe" can be modified or suppressed during operation of the filter by producing action on the impedance or impedances which serve to modify the transfer function of the filter. For example, the resistor or resistors of each impedance aforesaid can be replaced by one or a number of electrically adjustable resistors. These adjustable resistors can be field-effect transistors, photoresistive cells, control potentiometers or alternatively simulated resistors with switches and capacitors. The advantage of the arrangement just mentioned is that it can readily be integrated. The values of said adjustable resistors can be reduced to zero if necessary when the signal-to-noise ratio is substantial.

In the filter which has been described in the foregoing, it is wholly apparent that the means employed could have been replaced by equivalent means without thereby departing either from the scope or the spirit of the invention.

We claim:

1. An n-paths tracking filter for following a variable frequency input signal, comprising synchronization means for controlling the path switching, said synchronization means being connected to the output of the filter so as to be supplied by the filtered signal and to control the switching of each path, and means for providing a transfer function of the filter so that, before capture of the variable frequency input signal by the filter, a part of the variable frequency input signal will be present in the output signal of the filter, these means acting on each path of the filter, so that the filter provides the capture and track of the input signal when the frequency of this signal is varied.

2. A tracking filter according to claim 1, each path comprising a reactive element, the means for providing the said transfer function of the filter comprising an impedance connected in series with all the reactive elements of the n paths.

3. A tracking filter according to claim 1, each path comprising one reactive element, the means for providing the said transfer function of the filter comprising for each path an impedance connected in series with the reactive element of said each path.

4. A tracking filter according to claim 2 or claim 3, wherein said impedance comprises a resistor connected in parallel with a capacitor.

5. A tracking filter according to claim 2 or claim 3, wherein said impedance comprises an adjustable resistor connected in parallel with a capacitor.

6. A tracking filter according to claim 2 or claim 3, wherein said filter includes means for suppressing the impedance during tracking operation of the filter.

7. A tracking filter according to claim 1, wherein the synchronization means for switching each path further includes an amplifier of the automatic gain control type, said amplifier being connected to amplify the output signal of the n paths tracking filter.

8. A tracking filter according to claim 1, wherein each path is associated with two switches, one of said switches being adapted to put said path into communication with the input while the other of said switches puts said path into communication with the output, wherein said filter includes in parallel with the set of two switches a third set of switches and means for phase-shifting the signals which control the switches of said third set with respect to the signals which control the said set of two switches.

* * * * *